(12) United States Patent
Chiu

(10) Patent No.: US 12,727,211 B2
(45) Date of Patent: Sep. 1, 2026

(54) SEMICONDUCTOR DEVICE STRUCTURE WITH BACKSIDE PICK-UP REGION AND METHOD OF MANUFACTURING THE SAME

(71) Applicant: NANYA TECHNOLOGY CORPORATION, New Taipei City (TW)

(72) Inventor: Hsih-Yang Chiu, Taoyuan City (TW)

(73) Assignee: NANYA TECHNOLOGY CORPORATION, New Taipei City (TW)

( * ) Notice: Subject to any disclaimer, the term of this patent is extended or adjusted under 35 U.S.C. 154(b) by 376 days.

(21) Appl. No.: 18/398,247

(22) Filed: Dec. 28, 2023

(65) Prior Publication Data

US 2025/0194173 A1 Jun. 12, 2025

Related U.S. Application Data

(62) Division of application No. 18/536,597, filed on Dec. 12, 2023.

(51) Int. Cl.

| | |
|---|---|
| ***H10D 62/10*** | (2025.01) |
| ***H10D 84/85*** | (2025.01) |
| ***H10W 42/20*** | (2026.01) |
| ***H10W 72/20*** | (2026.01) |

(52) U.S. Cl.

CPC ......... *H10D 62/107* (2025.01); *H10D 84/859* (2025.01); *H10W 42/20* (2026.01); *H10W 72/252* (2026.01)

(58) Field of Classification Search

None

See application file for complete search history.

(56) References Cited

U.S. PATENT DOCUMENTS

| | | | |
|---|---|---|---|
| 2018/0197991 A1 | 7/2018 | Kim et al. | |
| 2021/0184033 A1 | 6/2021 | Coyne et al. | |
| 2021/0193643 A1 | 6/2021 | Hsu et al. | |
| 2022/0320071 A1 | 10/2022 | Hsu et al. | |

(Continued)

FOREIGN PATENT DOCUMENTS

| | | |
|---|---|---|
| TW | 201121049 A | 6/2011 |
| TW | 201407781 A | 2/2014 |

(Continued)

OTHER PUBLICATIONS

Office Action and and the search report mailed on Jul. 9, 2025 related to Taiwanese Application No. 113121473.

(Continued)

*Primary Examiner* — Jack S Chen

(74) *Attorney, Agent, or Firm* — Xuan Zhang

(57) ABSTRACT

A semiconductor device structure and method of manufacturing the same are provided. The semiconductor device structure includes a substrate, a first well region, a source/drain (S/D) feature, and a pick-up region. The substrate has a first surface and a second surface opposite to the first surface. The first well region abuts the second surface of the substrate and has a first conducive type. The S/D feature abuts the second surface of the substrate and has a second conductive type different from the first conductive type. The pick-up region abuts the first surface of the substrate and has the first conductive type.

10 Claims, 17 Drawing Sheets

(56) References Cited

U.S. PATENT DOCUMENTS

| | | | | |
|---|---|---|---|---|
| 2022/0336440 | A1 | 10/2022 | Hsu et al. | |
| 2023/0053444 | A1 | 2/2023 | Kim et al. | |
| 2023/0119204 | A1 | 4/2023 | Sarafianos et al. | |
| 2023/0335595 | A1 | 10/2023 | Chen et al. | |
| 2025/0194173 | A1* | 6/2025 | Chiu .................... | H10D 62/107 |
| 2025/0194174 | A1* | 6/2025 | Chiu .................... | H10D 62/107 |

FOREIGN PATENT DOCUMENTS

| | | | |
|---|---|---|---|
| TW | 201916174 | A | 4/2019 |
| TW | 202030866 | A | 8/2020 |
| TW | 202125763 | A | 7/2021 |
| TW | 202236395 | A | 9/2022 |
| TW | 202334188 | A | 9/2023 |
| TW | 202341479 | A | 10/2023 |
| TW | I879431 | B | 4/2025 |

OTHER PUBLICATIONS

Summary translations of Office Action and and the search report mailed on Jul. 9, 2025 and Notice of Allowance and the search report mailed on Aug. 20, 2025 related to Taiwanese Application No. 113121473.

Notice of Allowance and the search report mailed on Aug. 20, 2025 related to Taiwanese Application No. 113121473.

Office Action and and the search report mailed on Jan. 8, 2025 related to Taiwanese Application No. 113105458.

Summary translation of Office Action and and the search report mailed on Jan. 8, 2025 related to Taiwanese Application No. 113105458.

* cited by examiner

SEMICONDUCTOR DEVICE STRUCTURE WITH BACKSIDE PICK-UP REGION AND METHOD OF MANUFACTURING THE SAME

CROSS-REFERENCE TO RELATED APPLICATION

This application is a divisional application of U.S. Non-Provisional application Ser. No. 18/536,597 filed Dec. 12, 2023, which is incorporated herein by reference in its entirety.

TECHNICAL FIELD

The present disclosure relates to a semiconductor device structure, and in particularly to a semiconductor device structure with a backside pick-up region and a method of manufacturing the same.

DISCUSSION OF THE BACKGROUND

With the rapid growth of the electronics industry, the development of integrated circuits (ICs) has achieved high performance and miniaturization. Technological advances in IC materials and design have produced generations of ICs where each generation has smaller and more complex circuits than the previous generation.

A Dynamic Random Access Memory (DRAM) device is a type of random access memory that stores each bit of data in a separate capacitor within an integrated circuit. Typically, a DRAM is arranged in a square array of one capacitor and transistor per cell. A vertical transistor has been developed for the $4F^2$ DRAM cell, in which F represents the photolithographic minimum feature width or critical dimension (CD). However, recently, DRAM manufacturers are facing significant challenges as technology nodes improve.

This Discussion of the Background section is provided for background information only. The statements in this Discussion of the Background are not an admission that the subject matter disclosed herein constitutes prior art with respect to the present disclosure, and no part of this Discussion of the Background may be used as an admission that any part of this application constitutes prior art with respect to the present disclosure.

SUMMARY

One aspect of the present disclosure provides a semiconductor device structure. The semiconductor device structure includes a substrate, a first well region, a source/drain (S/D) feature, and pick-up region. The substrate has a first surface and a second surface opposite to the first surface. The first well region abuts the second surface of the substrate and has a first conducive type. The S/D feature abuts the second surface of the substrate and has a second conductive type different from the first conductive type. The pick-up region abuts the first surface of the substrate and has the first conductive type.

One aspect of the present disclosure provides a semiconductor device structure. The semiconductor device structure includes a substrate, a first well region, a source/drain (S/D) feature, an isolation feature, and a first pick-up region. The substrate has a first surface and a second surface opposite to the first surface. The first well region abuts the second surface of the substrate and has a first conducive type. The S/D feature abuts the second surface of the substrate and has a second conductive type different from the first conductive type. The isolation structure is embedded within the substrate and extends from the second surface toward the first surface of the substrate. The first pick-up region has the first conductive type situated between the first surface of the substrate and the isolation structure.

Another aspect of the present disclosure provides a method of manufacturing a semiconductor device structure. The method includes providing a substrate having a first surface and a second surface opposite to the first surface. The methods also includes forming a first well region abutting the second surface of the substrate. The first well region has a first conducive type. The method further includes forming a source/drain (S/D) feature abutting the second surface of the substrate. The S/D feature has a second conductive type different from the first conductive type. Moreover, the method includes forming a pick-up region abutting the first surface of the substrate. The pick-up region has the first conductive type.

The embodiments of the present disclosure provide a semiconductor device structure. The semiconductor device structure includes a pick-up region and a source/drain feature on opposite two surfaces of a substrate. The pick-up region is configured to provide a low resistance path to lead a drift current to flow out the semiconductor device structure through a backside surface. The pick-up region can provide a relatively short path for transmitting the drift current and reduce the leakage caused by a cosmic ray incident to the semiconductor device structure.

The foregoing has outlined rather broadly the features and technical advantages of the present disclosure so that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRA WINGS

A more complete understanding of the present disclosure may be derived by referring to the detailed description and claims when considered in connection with the Figures, where like reference numbers refer to similar elements throughout the Figures, and:

DETAILED DESCRIPTION

Figure 1:
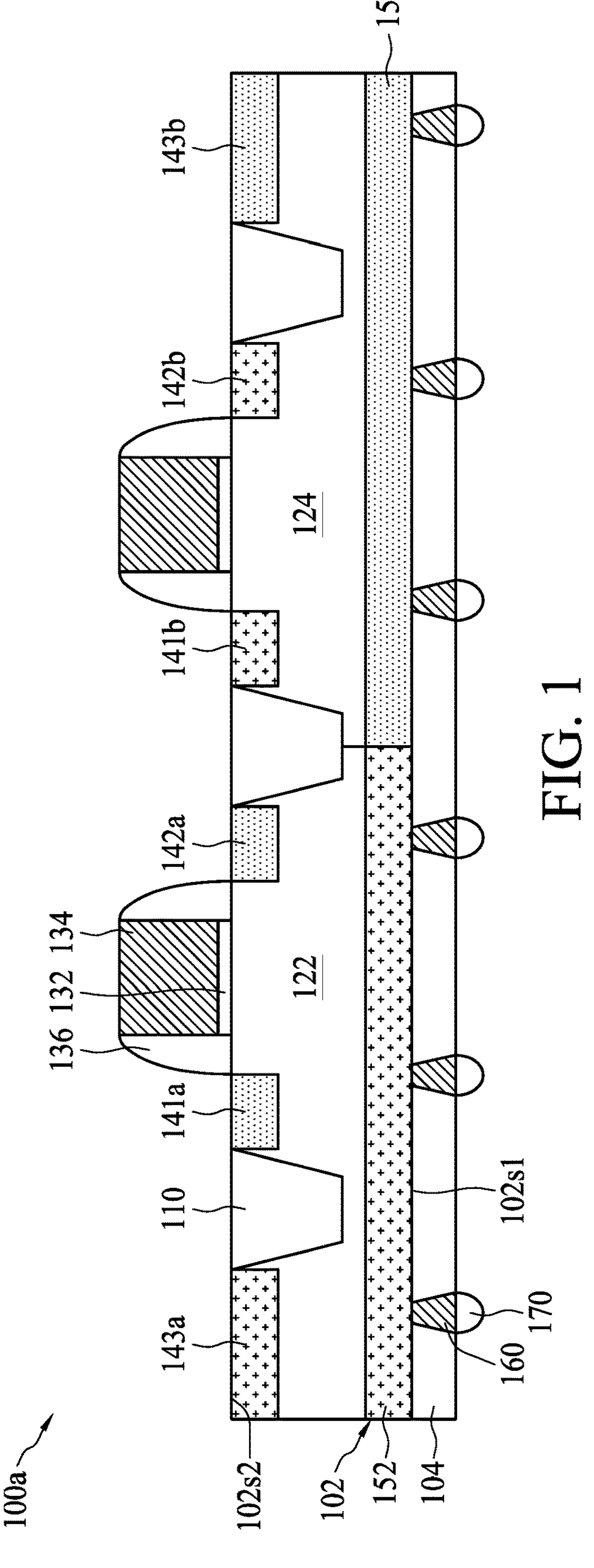
FIG. 1 illustrates a cross-section of a semiconductor device structure, in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that when an element is referred to as being "connected to" or "coupled to" another element, the initial element may be directly connected to, or coupled to, another element, or to other intervening elements.

It shall be understood that, although the terms first, second, third, etc., may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

It should be noted that the term "about" modifying the quantity of an ingredient, component, or reactant of the present disclosure employed refers to variation in the numerical quantity that may occur, for example, through typical measuring and liquid handling procedures used for making concentrates or solutions. Furthermore, variation may occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. In yet another aspect, the term "about" means within 10, 9, 8, 7, 6, 5, 4, 3, 2, or 1% of the reported numerical value.

FIG. 1 is a cross-section of a semiconductor device structure 100*a*, in accordance with some embodiments of the present disclosure. In some embodiments, the semiconductor device structure 100*a* may be included in a memory device, such as a dynamic random access memory (DRAM) device, a one-time programming (OTP) memory device, a static random access memory (SRAM) device, or other suitable memory devices.

In some embodiments, the semiconductor device structure 100*a* may include a substrate 102. The substrate 102 may be a semiconductor substrate, such as a bulk semiconductor, a semiconductor-on-insulator (SOI) substrate, or the like. The substrate 102 may include an elementary semiconductor including silicon or germanium in a single crystal form, a polycrystalline form, or an amorphous form; a compound semiconductor material including at least one of silicon carbide, gallium arsenide, gallium phosphide, indium phosphide, indium arsenide, and indium antimonide; an alloy semiconductor material including at least one of SiGe, GaAsP, AlInAs, AlGaAs, GaInAs, GaInP, and GaInAsP; any other suitable material; or a combination thereof. In some embodiments, the alloy semiconductor substrate may include a SiGe alloy with a gradient Ge feature in which the Si and Ge composition changes from one ratio at one location to another ratio at another location of the gradient SiGe feature. In another embodiment, the SiGe alloy is formed over a silicon substrate. In some embodiments, a SiGe alloy may be mechanically strained by another material in contact with the SiGe alloy. In some embodiments, the substrate 102 may have a multilayer structure, or the substrate 102 may include a multilayer compound semiconductor structure. The substrate 102 may have a surface 102*s*1 (or a lower surface or a backside surface) and a surface 102*s*2 (or an upper surface or an active surface) opposite to the surface 102*s*1. As used herein, the term "active surface" may refer to a surface on which a gate electrode and/or a source/drain feature is disposed.

In some embodiments, the semiconductor device structure 100*a* may include an isolation layer 104. The isolation layer 104 may be disposed on or under the surface 102*s*1 of the substrate 102. The isolation layer 104 may include a dielectric material. The isolation layer 104 may include a dielectric material, such as silicon oxide, silicon nitride, silicon oxynitride, or other suitable materials.

In some embodiments, the semiconductor device structure 100*a* may include an isolation structure 110. The isolation structure 110 may be at least partially embedded within the substrate 102. The isolation structure 110 may be recessed from the surface 102*s*2 and toward the surface 102*s*1. In some embodiments, the isolation structure 110 may be a shallow trench isolation (STI). In other embodiments, the isolation structure 110 may include a structure of a local oxidization of silicon (LOCOS) structure, or any other suitable isolation structure. The isolation structure 110 may include a dielectric material, such as silicon oxide, silicon nitride, or other suitable materials.

In some embodiments, the semiconductor device structure 100*a* may include a well region 122. In some embodiments, the well region 122 may be located within the substrate 102. The well region 122 may surround the isolation structure 110. In some embodiments, the well region 122 may cover the lower surface (not annotated) of the isolation structure 110. The well region 122 may have a first conductive type, such as an n type. In some embodiments, n type dopants include arsenic (As), phosphorus (P), antimony (Sb), other group V elements, or any combination thereof. In some embodiments, the dopant concentration of the well region 122 may range between 1E14 atoms/$cm^3$ and 1E16 atoms/$cm^3$.

In some embodiments, the semiconductor device structure 100*a* may include a well region 124. In some embodiments, the well region 124 may be located within the substrate 102. The well region 124 may abut the well region 122. The well region 124 may surround the isolation structure 110. In some embodiments, the well region 124 may cover the lower surface (not annotated) of the isolation structure 110. The well region 124 may have a second conductive type different from the first conductive type, such as a p type. In some embodiments, p type dopants include boron (B), other group III elements, or any combination thereof. In some embodiments, the dopant concentration of the well region 124 may range between 1E14 atoms/$cm^3$ and 1E16 atoms/$cm^3$.

In some embodiments, the semiconductor device structure 100*a* may include a gate dielectric layer 132. The gate dielectric layer 132 may be disposed on or over the surface 102*s*2 of the substrate 102. In some embodiments, the gate dielectric layer 132 may include dielectric material such as silicon oxide, silicon nitride, silicon oxynitride, other dielectric materials, or a combination thereof. In some embodiments, the gate dielectric layer 132 is a multi-layer structure that includes an interfacial layer and a high-k (dielectric constant greater than 4) dielectric layer. The interfacial layer can include dielectric material such as silicon oxide, silicon nitride, silicon oxynitride, other dielectric materials, or a combination thereof. The high-k dielectric layer can include high-k dielectric material such as $HfO_2$, HfSiO, HfSiON, HfTaO, HfTiO, HfZrO, other suitable high-k dielectric materials, or a combination thereof. In some embodiments, the high-k dielectric material can further be selected from metal oxides, metal nitrides, metal silicates, transition metal-oxides, transition metal-nitrides, transition-metal silicates, metal oxynitrides, metal aluminates, and combinations thereof.

In some embodiments, the semiconductor device structure 100*a* may include a gate electrode 134. The gate electrode 134 may be disposed on or over the gate dielectric layer 132. The gate electrode 134 may include polysilicon, silicon-germanium, and/or at least one metallic material including elements and compounds such as Mo, Cu, W, Ti, Ta, TiN, TaN, NiSi, CoSi, or other suitable conductive materials known in the art. In some embodiments, the gate electrode 134 includes a work function metal layer that provides a metal gate with an n-type-metal work function or p-type-metal work function. The p-type-metal work function materials include materials such as ruthenium, palladium, platinum, cobalt, nickel, conductive metal oxide, or other suitable materials. The n-type-metal work function materials include materials such as hafnium zirconium, titanium, tantalum, aluminum, metal carbides (e.g., hafnium carbide, zirconium carbide, titanium carbide, and aluminum carbide), aluminides, or other suitable materials.

In some embodiments, the semiconductor device structure 100*a* may include a spacer 136. The spacer 136 may be disposed on two opposite sides of the gate electrode 134 (or gate dielectric layer 132). In some embodiments, the spacer 136 includes a dielectric material such as silicon nitride, silicon oxide, silicon carbo-nitride, silicon oxynitride, silicon oxy-carbo-nitride, or the like, and may have a single-layer structure or a multi-layer structure including a plurality of dielectric layers.

In some embodiments, the semiconductor device structure 100*a* may include doped regions 141*a* and 142*a*. The doped regions 141*a* and 142*a* may be disposed within the substrate 102. The doped regions 141*a* and 142*a* may abut the surface 102*s*2 of the substrate 102. The doped regions 141*a* and 142*a* may be disposed within the well region 122. The doped regions 141*a* and 142*a* may collectively function as a source/drain (S/D) feature. Each of the doped regions 141*a* and 142*a* may have a second conductive type, such as a p type. In some embodiments, each of the dopant concentration of the doped regions 141*a* and 142*a* may range between 1E17 atoms/$cm^3$ and 1E20 atoms/$cm^3$. In some embodiments, the well region 122, doped region 141*a*, and doped region 142*a* may define a p-type metal-oxide-semiconductor field-effect transistor (PMOS).

In some embodiments, the semiconductor device structure 100*a* may include a pick-up region 143*a*. The pick-up region 143*a* may be disposed within the substrate 102. The pick-up region 143*a* may abut the surface 102*s*2 of the substrate 102. The pick-up region 143*a* may be disposed within the well region 122. The pick-up region 143*a* may be spaced apart from the S/D feature (e.g., the doped regions 141*a* and 142*a*) by the isolation structure 110. The pick-up region 143*a* may be configured to provide a low resistance path to lead a current (e.g., a drift current) or the like to flow out the semiconductor device structure 100*a* through the surface 102*s*2 of the substrate 102. The pick-up region 143*a* may have a first conductive type, such as an n type. In some embodiments, the dopant concentration of the pick-up region 143*a* may range between 1E17 atoms/$cm^3$ and 1E20 atoms/$cm^3$.

In some embodiments, the semiconductor device structure 100*a* may include a doped region 141*b* and a doped region 142*b*. The doped regions 141*b* and 142*b* may be disposed within the substrate 102. The doped regions 141*b* and 142*b* may abut the surface 102*s*2 of the substrate 102. The doped regions 141*b* and 142*b* may be disposed within the well region 124. The doped regions 141*b* and 142*b* may collectively function as a source/drain feature. Each of the doped regions 141*b* and 142*b* may have a first conductive type, such as an n type. In some embodiments, each of the dopant concentration of the doped regions 141*b* and 142*b* may range between 1E17 atoms/$cm^3$ and 1E20 atoms/$cm^3$. In some embodiments, the well region 124, doped region 141*b*, and doped region 142*b* may define an n-type metal-oxide-semiconductor field-effect transistor (NMOS).

In some embodiments, the semiconductor device structure 100*a* may include a pick-up region 143*b*. The pick-up region 143*b* may be disposed within the substrate 102. The pick-up region 143*b* may abut the surface 102*s*2 of the substrate 102. The pick-up region 143*b* may be disposed within the well region 124. The pick-up region 143*b* may be spaced apart from the S/D feature (e.g., the doped regions 141*b* and 142*b*) by the isolation structure 110. The pick-up region 143*b* may be configured to provide a low resistance path to lead a drift current or the like to flow out the semiconductor device structure 100*a* through the surface 102*s*2 of the substrate 102. The pick-up region 143*b* may have a second conductive type, such as a p type. In some embodiments, the dopant concentration of the pick-up region 143*b* may range between 1E17 atoms/$cm^3$ and 1E20 atoms/$cm^3$.

In some embodiments, the semiconductor device structure 100*a* may include a pick-up region 152. The pick-up region 152 may be disposed within the substrate 102. In some embodiments, the pick-up region 152 may abut the surface 102*s*1 of the substrate 102. In some embodiments, the pick-up region 152 may be exposed by the surface 102*s*1 of the substrate 102. In some embodiments, the pick-up region 152 may be spaced apart from the isolation structure 110. In some embodiments, the pick-up region 152 may be located under the lower surface of the isolation structure 110. In some embodiments, the pick-up region 152 may abut or be in contact with the well region 122.

In some embodiments, the pick-up region 152 may be configured to provide a low resistance path to lead a drift current or the like to flow out the semiconductor device structure 100*a* through the surface 102*s*1 of the substrate 102. The pick-up region 152 may have a first conductive type, such as an n type. In some embodiments, the dopant concentration of the pick-up region 152 may be greater than that of the well region 122. In some embodiments, the dopant concentration of the pick-up region 152 may range between 1E17 atoms/$cm^3$ and 1E20 atoms/$cm^3$. In some embodiments, the dopant concentration of the pick-up region 152 may be substantially equal to that of the pick-up region 143*a*. In some embodiments, the dopant concentration of the pick-up region 152 may be electrically connected to ground. In some embodiments, a power, which the same as that imposed on the pick-up region 143*a*, may be imposed on the pick-up region 152.

In some embodiments, the semiconductor device structure 100*a* may include a pick-up region 154. The pick-up region 154 may be disposed within the substrate 102. In some embodiments, the pick-up region 154 may abut the surface 102*s*1 of the substrate 102. In some embodiments, the pick-up region 154 may be exposed by the surface 102*s*1 of the substrate 102. In some embodiments, the pick-up region 154 may be spaced apart from the isolation structure 110. In some embodiments, the pick-up region 154 may be located under the lower surface of the isolation structure 110. In some embodiments, the pick-up region 154 may abut or be in contact with the well region 124.

In some embodiments, the pick-up region 154 may be configured to provide a low resistance path to lead a drift current or the like to flow out the semiconductor device structure 100*a* through the surface 102*s*1 of the substrate 102. The pick-up region 154 may have a second conductive type, such as a p type. In some embodiments, the dopant concentration of the pick-up region 154 may be greater than that of the well region 124. In some embodiments, the dopant concentration of the pick-up region 154 may range between 1E17 atoms/$cm^3$ and 1E20 atoms/$cm^3$. In some embodiments, the dopant concentration of the pick-up region 154 may be substantially equal to that of the pick-up region 143*b*. In some embodiments, the dopant concentration of the pick-up region 154 may be electrically connected to ground. In some embodiments, a power, the same as that imposed on the pick-up region 143*b*, may be imposed on the pick-up region 154.

In some embodiments, the semiconductor device structure 100*a* may include conductive elements 160. In some embodiments, the conductive element 160 may be disposed on or under the surface 102*s*1 of the substrate 102. In some embodiments, the conductive element 160 may be embedded within the isolation layer 104. In some embodiments, the conductive element 160 may be in contact with or electrically connected to the pick-up region 152 (or 154). The conductive element 160 may include a conductive via, pillar, or other suitable conductive elements. The conductive element 160 may include a conductive material, such as tungsten (W), copper (Cu), titanium (Ti), silver (Ag), aluminum (Al), titanium aluminum alloy (TiAl), titanium aluminum nitride (TiAIN), tantalum carbide (TaC), tantalum carbon nitride (TaCN), tantalum silicon nitride (TaSiN), manganese (Mn), zirconium (Zr), titanium nitride (TiN), tungsten nitride (WN), tantalum nitride (TaN), ruthenium (Ru) or a combination thereof.

In some embodiments, the semiconductor device structure 100*a* may include electrical connectors 170. The electrical connector 170 may be disposed on or under the conductive element 160. The electrical connector 170 may be electrically connected to the conductive element 160. The electrical connector 170 may be configure to be connected to an external device, such as a printed circuit board or a power supply. In some embodiments, the electrical connector 170 may include a ball grid array (BGA). In other embodiments, the electrical connector 170 includes an array such as, but not limited to, a land grid array (LGA) or a pin grid array (PGA). In some embodiments, the electrical connector 170 includes solder balls, which may include lead or may be lead-free (e.g., including one or more materials such as alloys of gold and tin solder or alloys of silver and tin solder).

Figure 2:
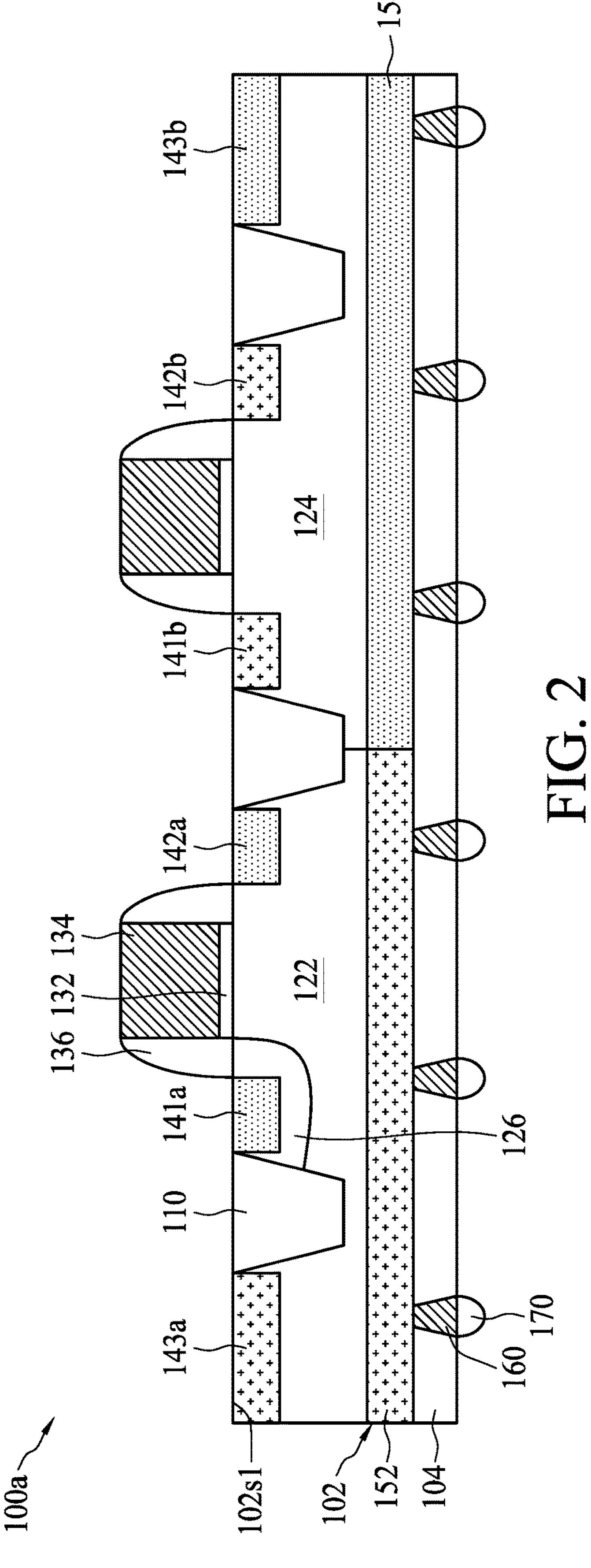
FIG. 2 is a schematic view of a semiconductor device structure including a depletion region, in accordance with some embodiments of the present disclosure.
Figure 3:
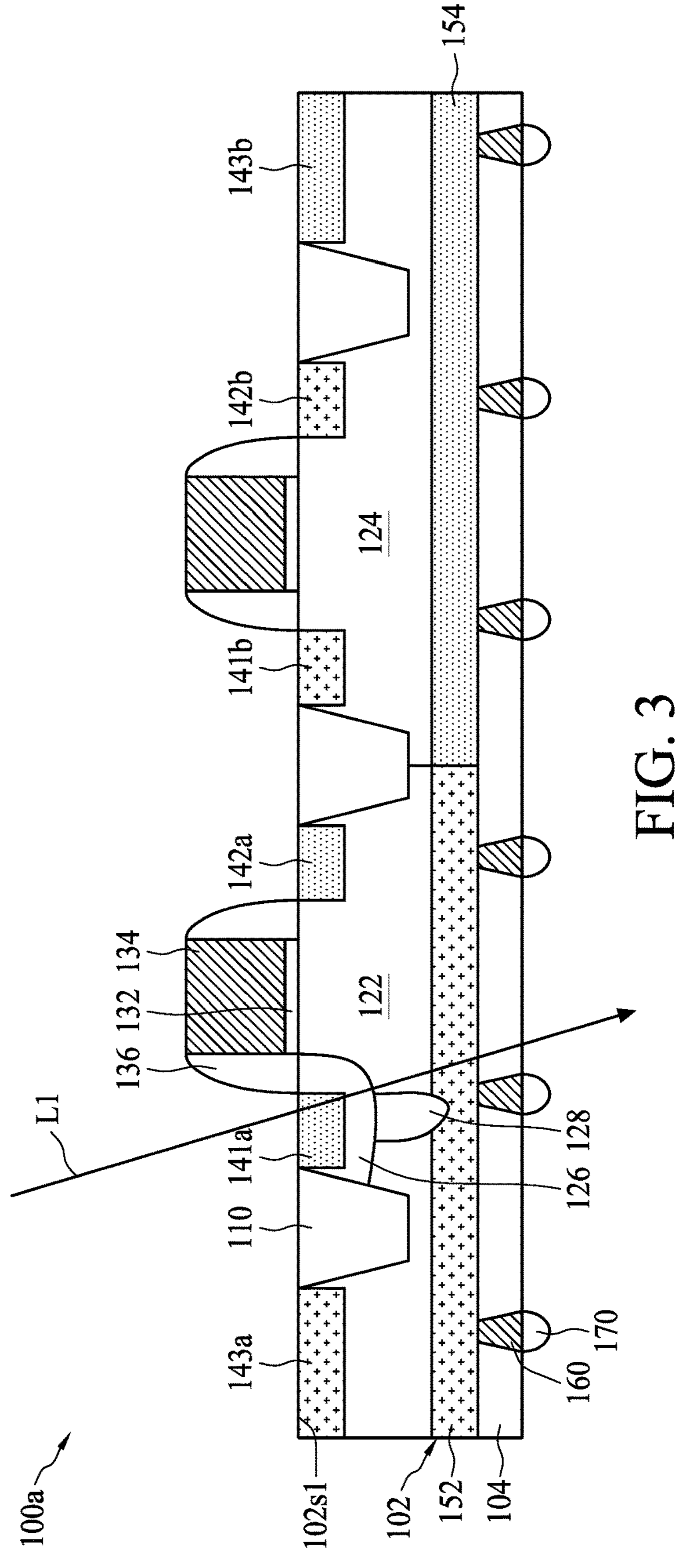
FIG. 3 is a schematic view of a semiconductor device structure including an induced depletion region, in accordance with some embodiments of the present disclosure.

FIG. 2 and FIG. 3 are schematic views of illustrating a semiconductor device structure 100*a* including a depletion region and an induced depletion region.

As shown in FIG. 2, the semiconductor device structure 100*a* may include a depletion 126 between the doped region 141*a* and the well region 122. Although not shown in FIG. 2, it should be notated that the semiconductor device structure 100*a* may include other depletion regions located between doped regions and/or well regions with different conductive types.

As shown in FIG. 3, an induced depletion 128 may be generated when a cosmic ray L1 is incident to the semiconductor device structure 100*a*. The cosmic ray L1 may include a high-energy particles or clusters of particles (e.g., protons, neutrons, or other particles). The induced depletion 128 may extend from the depletion 126 and extend along a direction substantially the same as or similar to the incident direction of the cosmic ray L1.

When the cosmic ray L1 passes through the semiconductor device structure 100*a*, multiple electron-hole pairs are generated, which thereby forms the induced depletion 128. As a result, a drift current may be generated. In some conditions that the pick-up region 152 and/or pick-up region 154 is not formed, said drift current may be guided to the surface 102*s*2 of the substrate 102 through the well region 122 and pick-up region 143*a*, which passes across the isolation structure 110. However, this path is relatively long. In this condition, the drift current induced by the cosmic ray L1 may cause an electrical leakage.

In some embodiments of the present disclosure, the pick-up region 152 (or pick-up region 154) may be configured to provide a path to guide the drift current to flow out through the surface 102*s*1 of the substrate 102 or neutralize the carriers in the induced depletion 128. As a result, an electrical leakage can be reduced. In some embodiments, the pick-up region 152 (or pick-up region 154) is in contact with the induced depletion 128. Therefore, the depth and/or height of the pick-up region 152 may depend on the profile of the induced depletion 128, which depends on the dopant concentrations of the S/D feature, well regions, and/or other doped regions.

Figure 4:
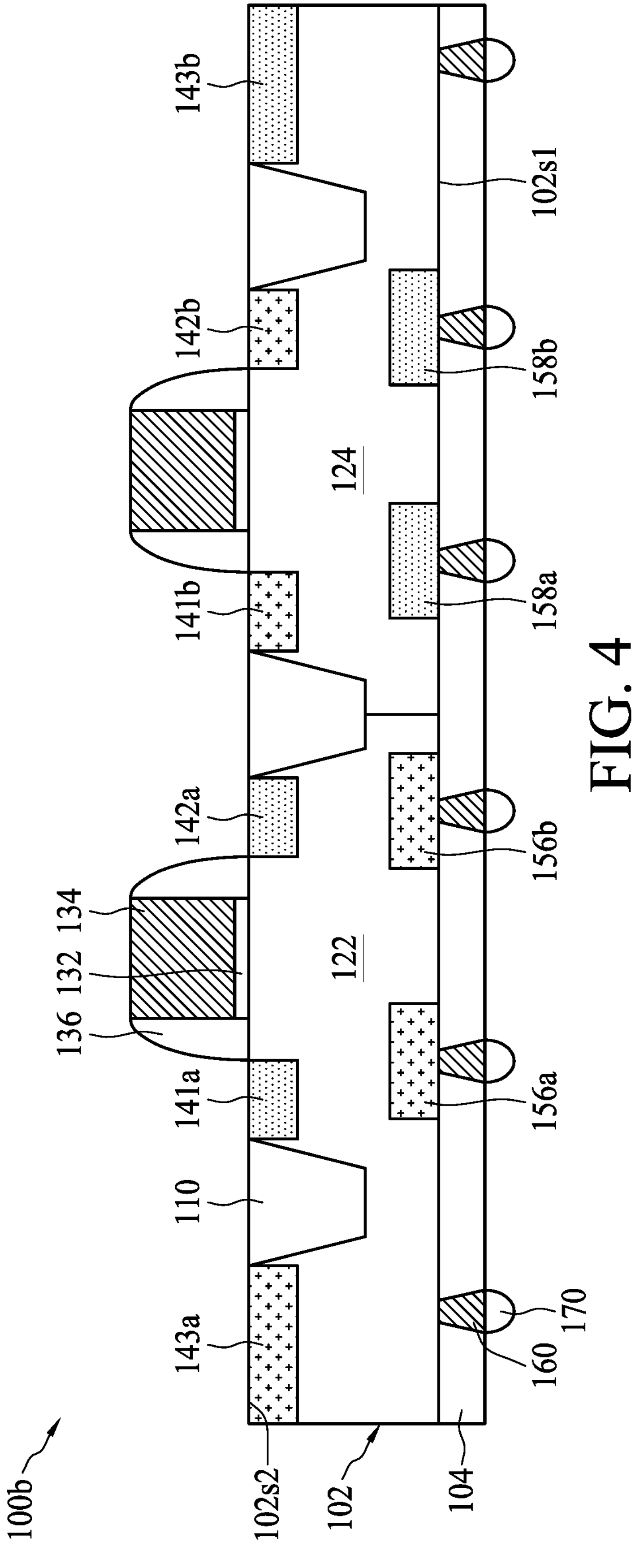
FIG. 4 illustrates a cross-section of a semiconductor device structure, in accordance with some embodiments of the present disclosure.

FIG. 4 illustrates a cross-section of a semiconductor device structure 100*b*, in accordance with some embodiments of the present disclosure. The semiconductor device structure 100*b* is similar to the semiconductor device structure 100*a* as shown in FIG. 1, with differences therebetween as follows.

In some embodiments, the semiconductor device structure 100*b* may include a pick-up region 156*a* and a pick-up region 156*b*. In some embodiments, the pick-up region 156*a* may be spaced apart from the pick-up region 156*b*. Each of the pick-up regions 156*a* and 156*b* may be disposed within the substrate 102. In some embodiments, the pick-up region 156*a* may be disposed below the doped region 141*a*. The pick-up region 156*a* may vertically overlap the doped region 141*a*. In some embodiments, the pick-up region 156*b* may be disposed below the doped region 142*a*. The pick-up region 156*b* may vertically overlap the doped region 142*a*.

In some embodiments, each of the pick-up regions 156*a* and 156*b* may abut the surface 102*s*1 of the substrate 102. In some embodiments, each of the pick-up regions 156*a* and 156*b* may be exposed by the surface 102*s*1 of the substrate 102. In some embodiments, each of the pick-up regions 156*a* and 156*b* may be spaced apart from the isolation structure 110. In some embodiments, each of the pick-up regions 156*a* and 156*b* may be located under the lower surface of the isolation structure 110. In some embodiments, each of the pick-up regions 156*a* and 156*b* may abut or be in contact with the well region 122. In some embodiments, the well region 122 may further disposed between the pick-up regions 156*a* and 156*b*. In some embodiments, each of the pick-up regions 156*a* and 156*b* may be configured to provide a low resistance path to lead a drift current or the like to flow out the semiconductor device structure 100*b* through the surface 102*s*1 of the substrate 102. For example, the pick-up region 156*a* may be configured to guide a drift current caused by an induced depletion region from the doped region 141*a* or neutralize the carriers from the induced depletion region of the doped region 141*a*, and the pick-up region 156*b* may be configured to guide a drift current caused by an induced depletion region from the doped region 142*a* or neutralize the carriers from the induced depletion region of the doped region 142*a*. Each of the pick-up regions 156*a* and 156*b* may have a first conductive type, such as an n type. In some embodiments, the dopant concentration of each of the pick-up regions 156*a* and 156*b* may range between 1E17 atoms/$cm^3$ and 1E20 atoms/$cm^3$.

In some embodiments, the semiconductor device structure 100*b* may include a pick-up region 158*a* and a pick-up region 158*b*. In some embodiments, the pick-up region 158*a* may be spaced apart from the pick-up region 158*b*. Each of the pick-up regions 158*a* and 158*b* may be disposed within the substrate 102. In some embodiments, the pick-up region 158*a* may be disposed below the doped region 141*b*. The pick-up region 158*a* may vertically overlap the doped region 141*b*. In some embodiments, the pick-up region 158*b* may be disposed below the doped region 142*b*. The pick-up region 158*b* may vertically overlap the doped region 142*b*.

In some embodiments, each of the pick-up regions 158*a* and 158*b* may abut the surface 102*s*1 of the substrate 102. In some embodiments, each of the pick-up regions 158*a* and 158*b* may be exposed by the surface 102*s*1 of the substrate 102. In some embodiments, each of the pick-up regions 158*a* and 158*b* may be spaced apart from the isolation structure 110. In some embodiments, each of the pick-up regions 158*a* and 158*b* may be located under the lower surface of the isolation structure 110. In some embodiments, each of the pick-up regions 158*a* and 158*b* may abut or be in contact with the well region 124. In some embodiments, the well region 122 may further disposed between the pick-up regions 158*a* and 158*b*. In some embodiments, each of the pick-up regions 158*a* and 158*b* may be configured to provide a low resistance path to lead a drift current or the like to flow out the semiconductor device structure 100*b* through the surface 102*s*1 of the substrate 102 or neutralize the carriers within an induced depletion region. For example, the pick-up region 158*a* may be configured to guide a drift current caused by an induced depletion region from the doped region 141*b* or neutralize the carriers from the induced depletion region of the doped region 141*b*, and the pick-up region 158*b* may be configured to guide a drift current caused by an induced depletion region from the doped region 142*b* or neutralize the carriers from the induced depletion region of the doped region 142*b*. Each of the pick-up regions 158*a* and 158*b* may have a second conductive type, such as a p type. In some embodiments, the dopant concentration of each of the pick-up regions 158*a* and 158*b* may range between 1E17 atoms/$cm^3$ and 1E20 atoms/$cm^3$.

Figure 5:
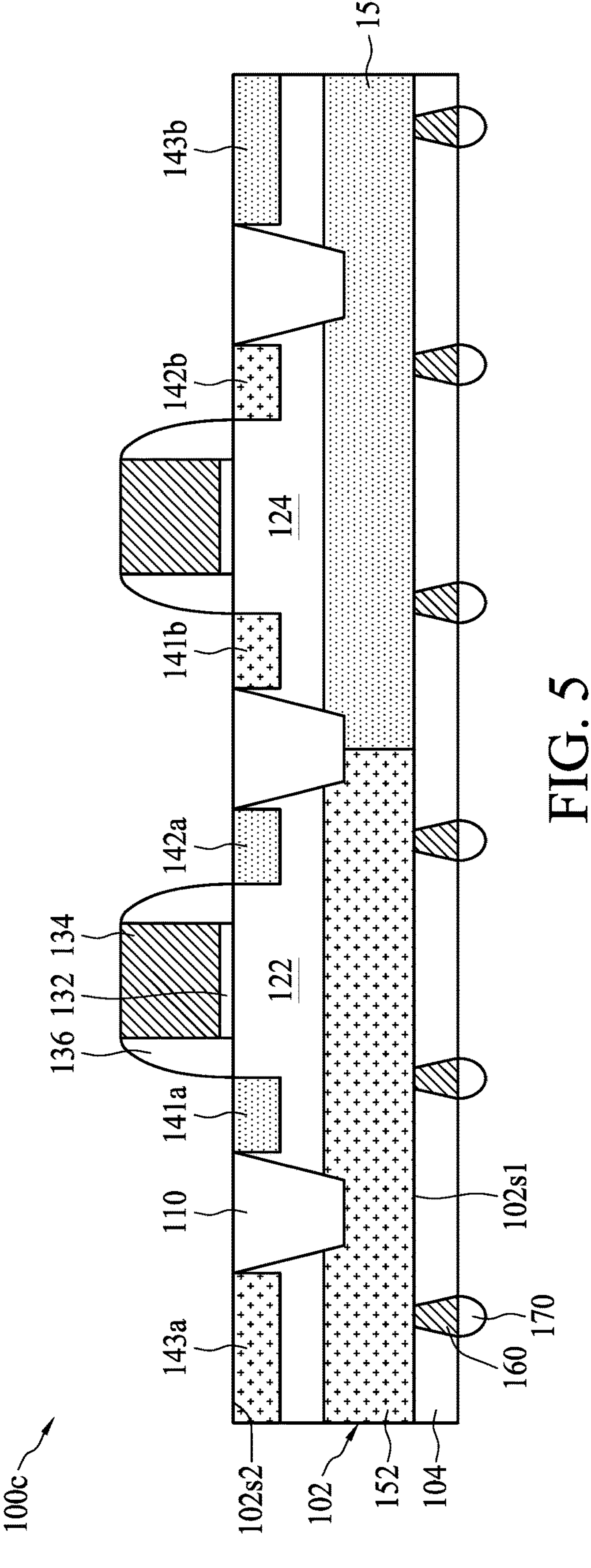
FIG. 5 illustrates a cross-section of a semiconductor device structure, in accordance with some embodiments of the present disclosure.

FIG. 5 illustrates a cross-section of a semiconductor device structure 100*c*, in accordance with some embodiments of the present disclosure. The semiconductor device structure 100*c* is similar to the semiconductor device structure 100*a* as shown in FIG. 1, with differences therebetween as follows.

In some embodiments, the boundary between the well region 122 and the pick-up region 152 may be located at an elevation higher than that of the lower surface of the isolation structure 110. In some embodiments, the pick-up region 152 may cover or be in contact with the lateral surface (not annotated) of the isolation structure 110. In some embodiments, the pick-up region 152 may be in contact with the lower surface of the isolation structure 110.

In some embodiments, the boundary between the well region 124 and the pick-up region 154 may be located an elevation higher than the lower surface of the isolation structure 110. In some embodiments, the pick-up region 154 may cover the lateral surface (not annotated) of the isolation structure 110. In some embodiments, the pick-up region 154 may be in contact with the lower surface of the isolation structure 110.

Figure 6:
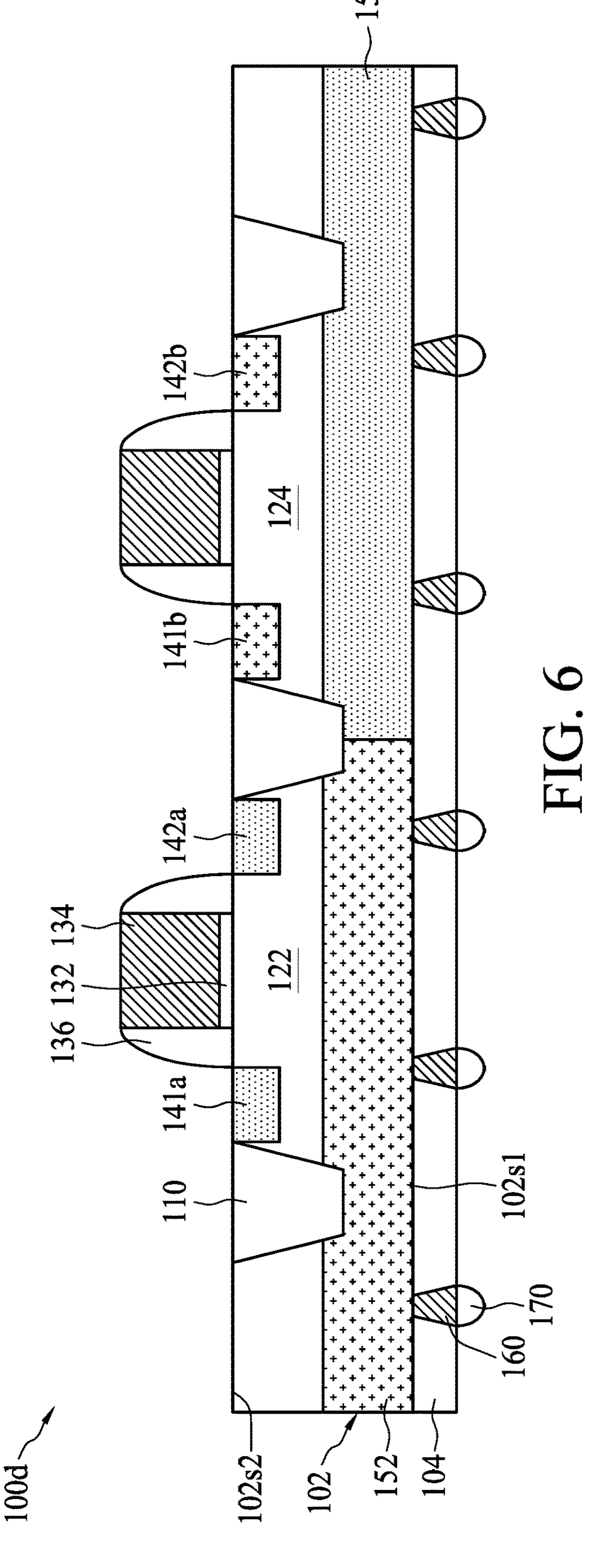
FIG. 6 illustrates a cross-section of a semiconductor device structure, in accordance with some embodiments of the present disclosure.

FIG. 6 illustrates a cross-section of a semiconductor device structure 100*d*, in accordance with some embodiments of the present disclosure. The semiconductor device structure 100*d* is similar to the semiconductor device structure 100*a* as shown in FIG. 1, with differences therebetween as follows.

In some embodiments, the semiconductor device structure 100*d* may be free of formation of the pick-up region 143*a* as shown in FIG. 1. In some embodiments, the semiconductor device structure 100*d* may be free of formation of the pick-up region 143*b* as shown in FIG. 1.

FIG. 7, FIG. 8, FIG. 9, FIG. 10, FIG. 11, FIG. 12, FIG. 13, FIG. 14, FIG. 15, and FIG. 16 illustrate stages of an exemplary method for manufacturing a semiconductor device structure according to some embodiments of the present disclosure.

Figure 7:
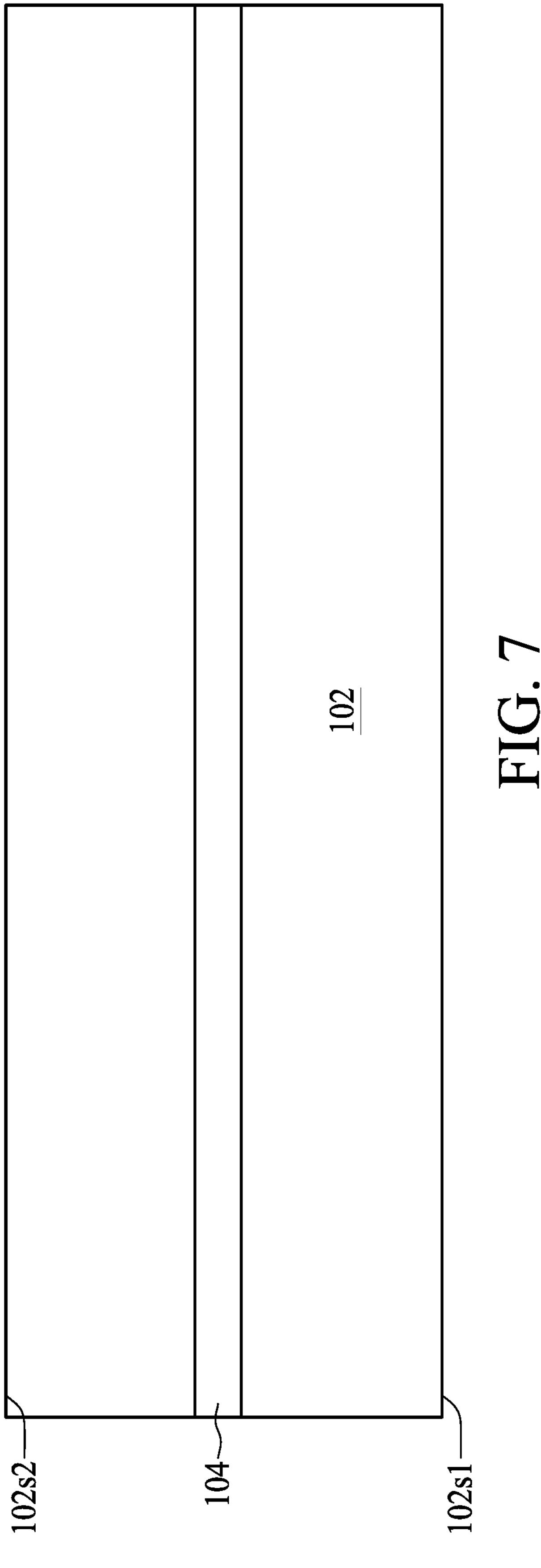
FIG. 7 illustrates one or more stages of an exemplary method for manufacturing a semiconductor device structure according to some embodiments of the present disclosure.

Referring to FIG. 7, a substrate 102 may be provided. In some embodiments, the substrate 102 is a semiconductor-on-insulator (SOI) substrate. An isolation layer 104 is disposed between a first portion (or a lower portion) and a second portion (or an upper portion) of the substrate 102. The substrate 102 has a surface 102_s_1 and a surface 102_s_2 opposite to the surface 102_s_1.

Figure 8:
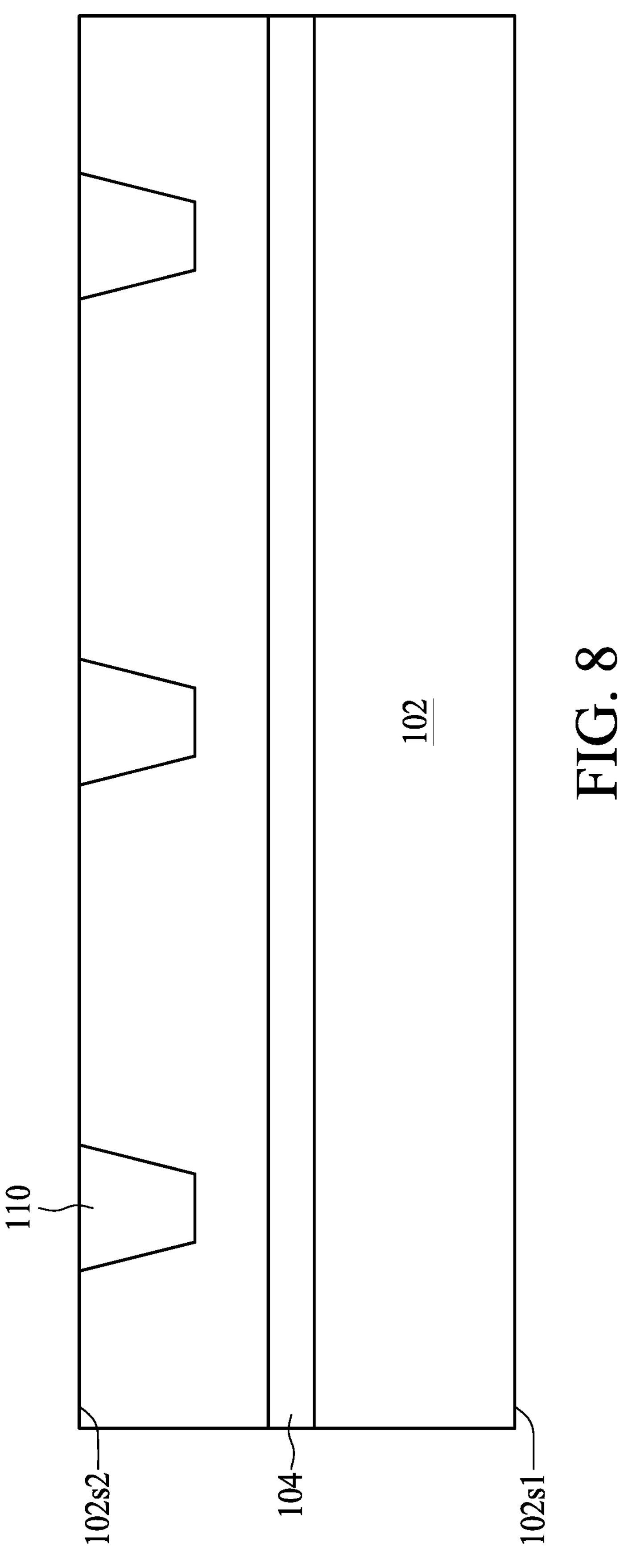
FIG. 8 illustrates one or more stages of an exemplary method for manufacturing a semiconductor device structure according to some embodiments of the present disclosure.

Referring to FIG. 8, an isolation structure 110 may be formed. The isolation structure 110 may abut the surface 102_s_2 of the substrate 102. In some embodiments, the isolation structure 110 includes a liner oxide (not shown), which may be a thermal oxide formed through a thermal oxidation of a surface layer of the substrate 102. The liner oxide may also be a deposited silicon oxide layer formed using, for example, atomic layer deposition (ALD), high-density plasma chemical vapor deposition (HDPCVD), chemical vapor deposition (CVD), or other suitable techniques. The isolation structure 110 may also include a dielectric material over the liner oxide, wherein the dielectric material may be formed using flowable chemical vapor deposition (FCVD), spin-on, or the like. An anneal technique may be formed after forming the isolation structure 110.

Figure 9:
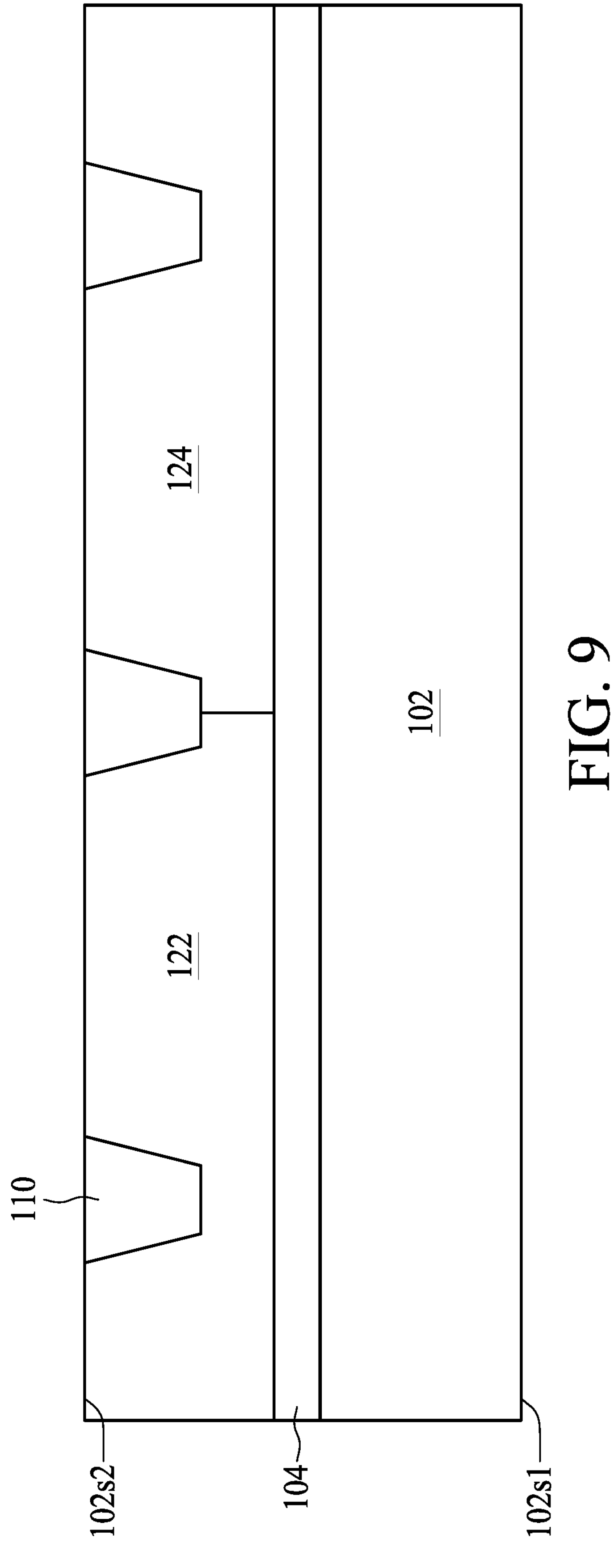
FIG. 9 illustrates one or more stages of an exemplary method for manufacturing a semiconductor device structure according to some embodiments of the present disclosure.

Referring to FIG. 9, a well region 122 and a well region 124 may be formed. The well region 122 may be formed within the second portion (or upper portion) of the substrate 102. The well region 124 may be formed within the second portion (or upper portion) of the substrate 102.

Figure 10:
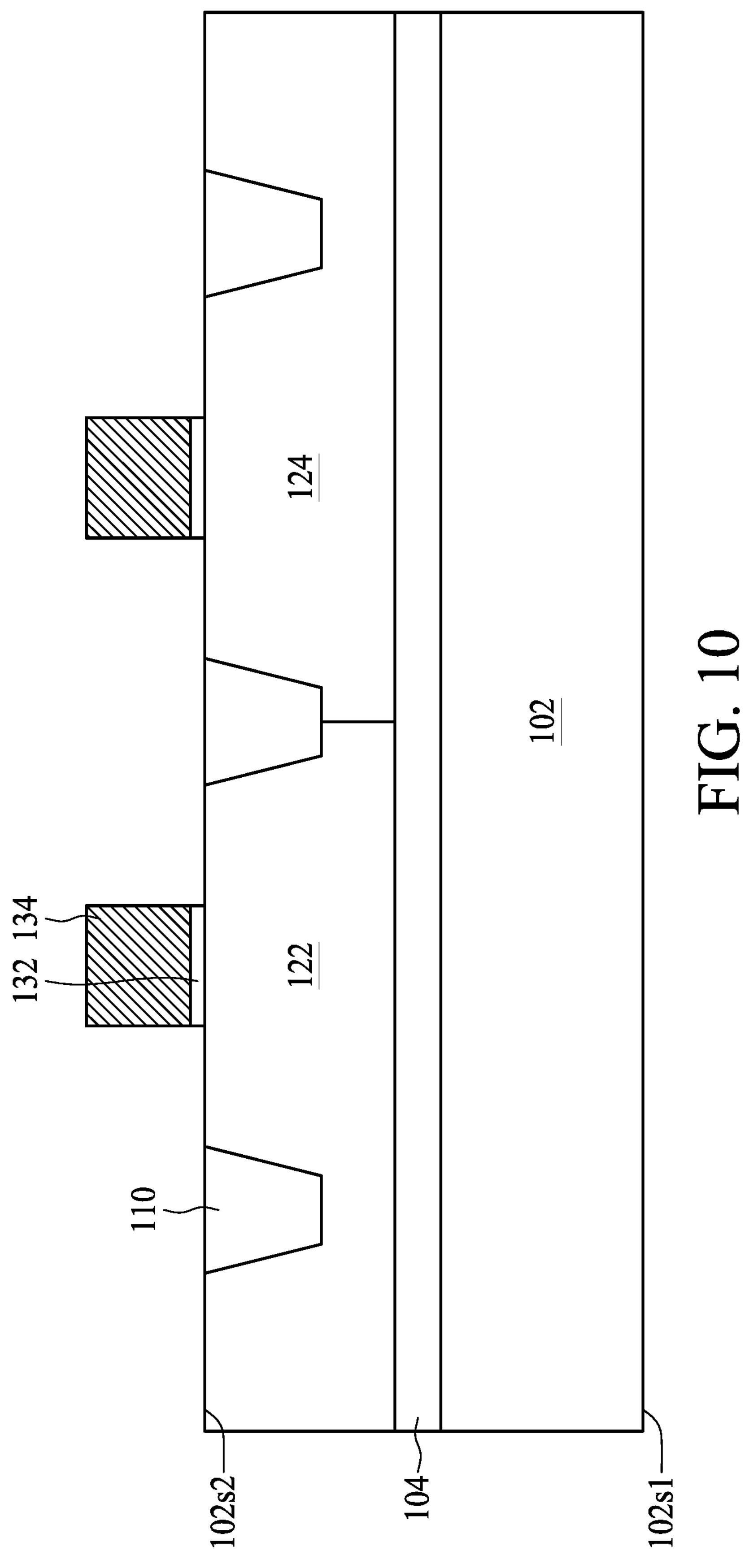
FIG. 10 illustrates one or more stages of an exemplary method for manufacturing a semiconductor device structure according to some embodiments of the present disclosure.

Referring to FIG. 10, a gate dielectric layer 132 and a gate electrode 134 may be formed on or over the surface 102_s_2 of the substrate 102. In some embodiments, a gate dielectric material and a gate electrode material (not shown) may be formed by ALD, CVD, FCVD, or other suitable techniques. Further, an etching technique(s) may be performed to pattern the gate dielectric material and a gate electrode material, which thereby forms the gate dielectric layer 132 and the gate electrode 134.

Figure 11:
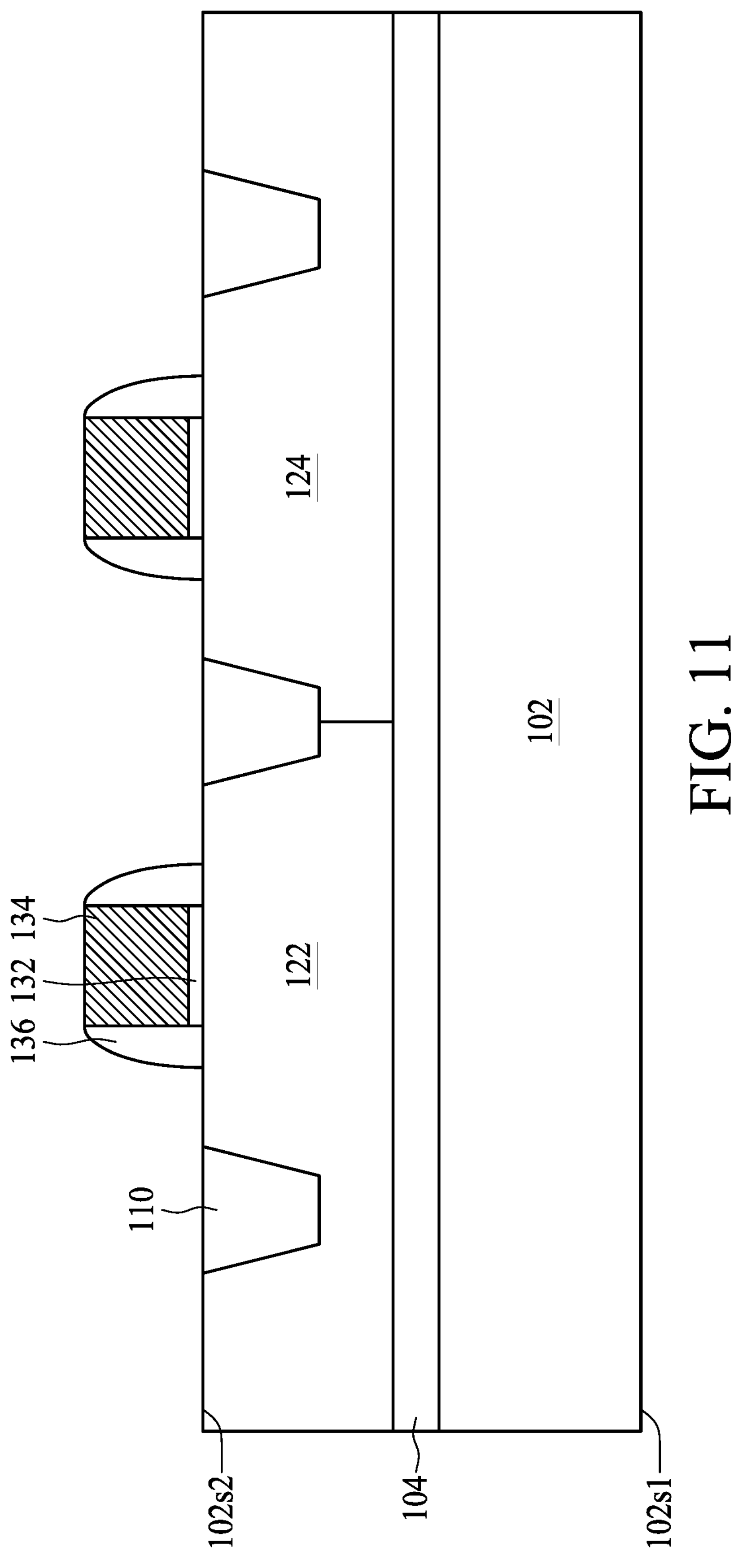
FIG. 11 illustrates one or more stages of an exemplary method for manufacturing a semiconductor device structure according to some embodiments of the present disclosure.

Referring to FIG. 11, a spacer 136 may be formed on two opposite sides of the gate dielectric layer 132 and the gate electrode 134. The spacer 136 may be formed by ALD, CVD, and/or FCVD as well as etching techniques.

Figure 12:
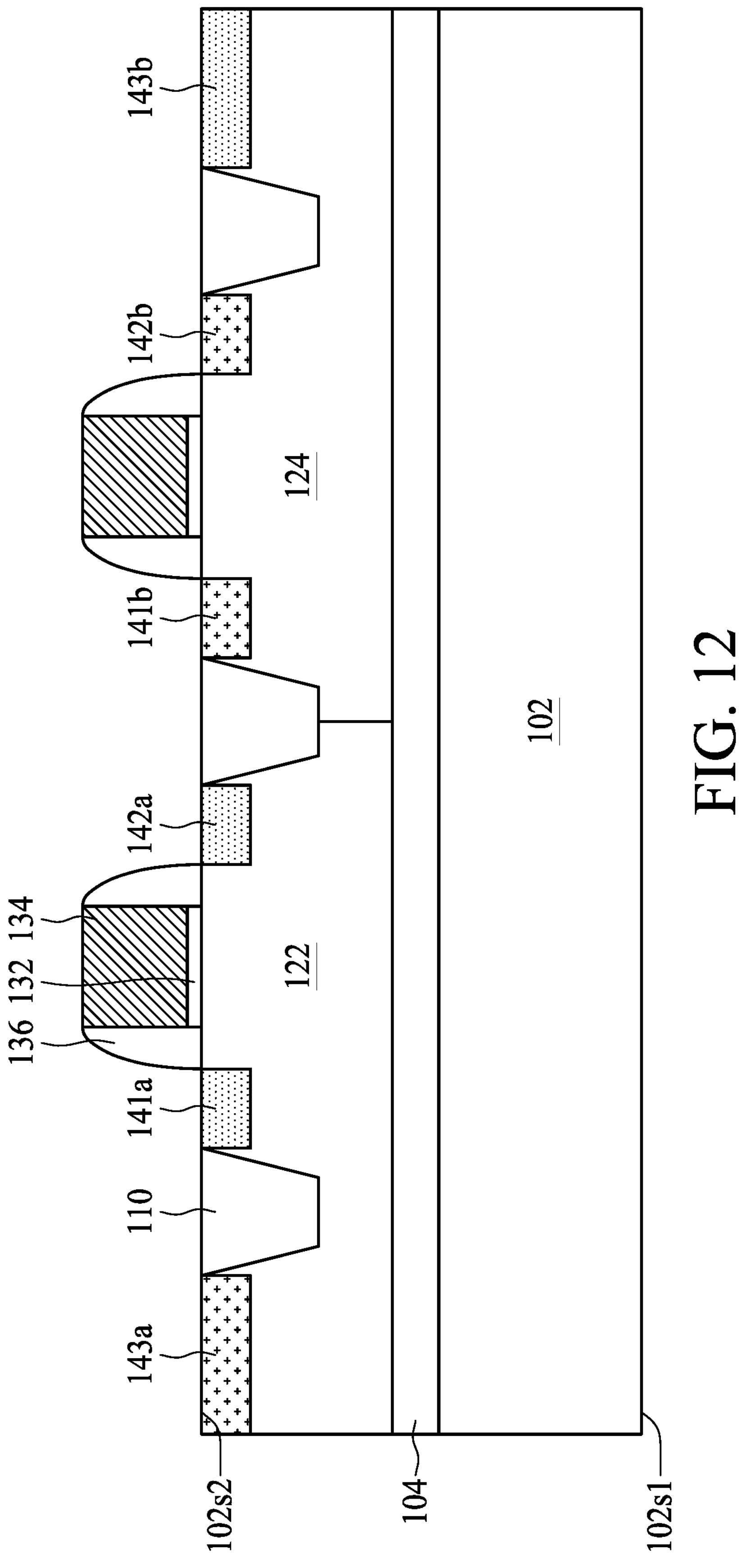
FIG. 12 illustrates one or more stages of an exemplary method for manufacturing a semiconductor device structure according to some embodiments of the present disclosure.

Referring to FIG. 12, doped regions 141_a_, 141_b_, 142_a_, and 142_b_ may be formed adjacent to the surface 102_s_2 of the substrate 102. Pick-up regions 143_a_ and 143_b_ may be formed abutting the surface 102_s_2 of the substrate 102. The doped region 141_a_, the doped region 142_a_, and the pick-up region 143_a_ may be formed within the well region 122. The doped region 141_b_, the doped region 142_b_, and the pick-up region 143_b_ may be formed within the well region 124.

Figure 13:
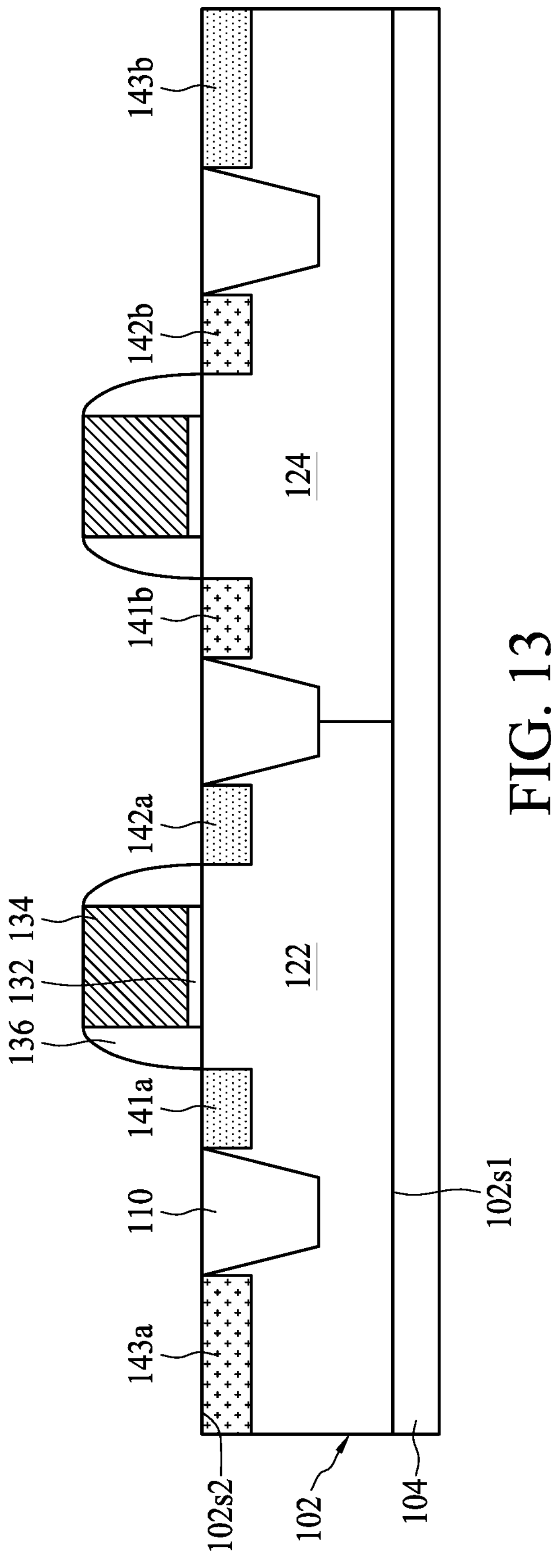
FIG. 13 illustrates one or more stages of an exemplary method for manufacturing a semiconductor device structure according to some embodiments of the present disclosure.

Referring to FIG. 13, a portion (e.g., the lower portion) of the substrate 102 may be removed. The isolation layer 104 may be exposed. A grinding technique or a polishing technique (e.g., a chemical mechanical polishing technique) may be performed to remove the lower portion of the substrate 102.

Figure 14:
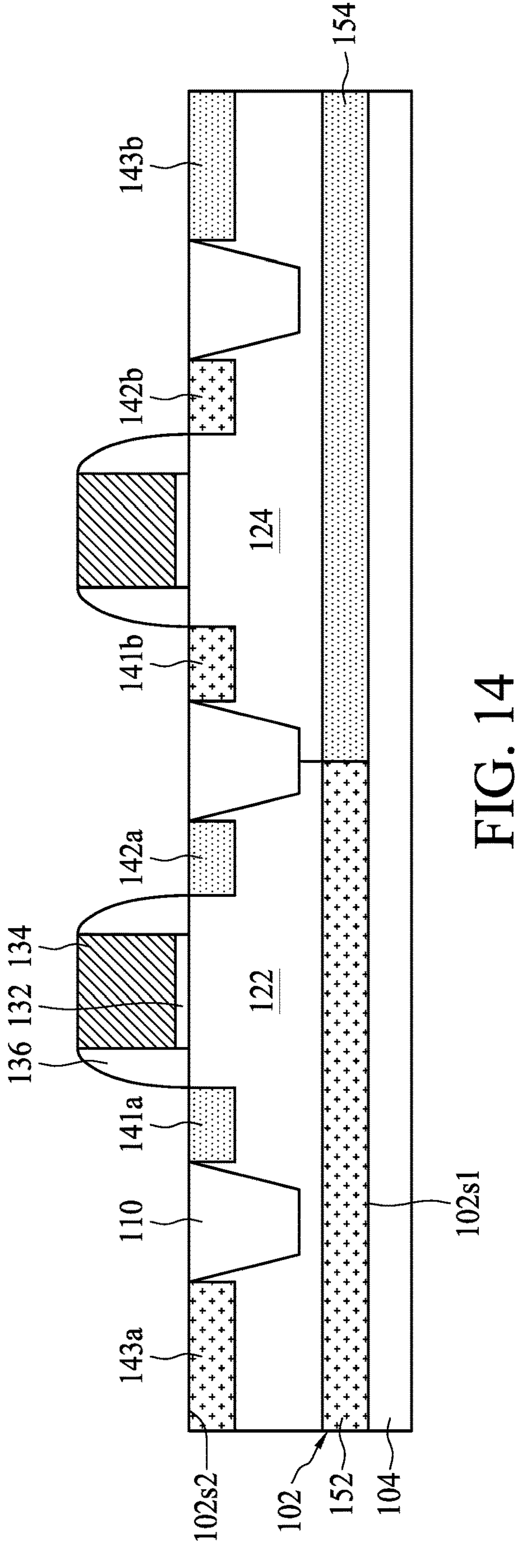
FIG. 14 illustrates one or more stages of an exemplary method for manufacturing a semiconductor device structure according to some embodiments of the present disclosure.

Referring to FIG. 14, a pick-up region 152 and a pick-up region 154 may be formed. The pick-up region 152 may abut the surface 102_s_1 of the substrate 102. The pick-up region 152 may be in contact with or abut the well region 122. The pick-up region 154 may abut the surface 102_s_1 of the substrate 102. The pick-up region 154 may be in contact with or abut the well region 124. In some embodiments, dopants may be implanted to the substrate 102 through the surface 102_s_1 of the substrate 102, which thereby forms the pick-up regions 152 and 154.

Figure 15:
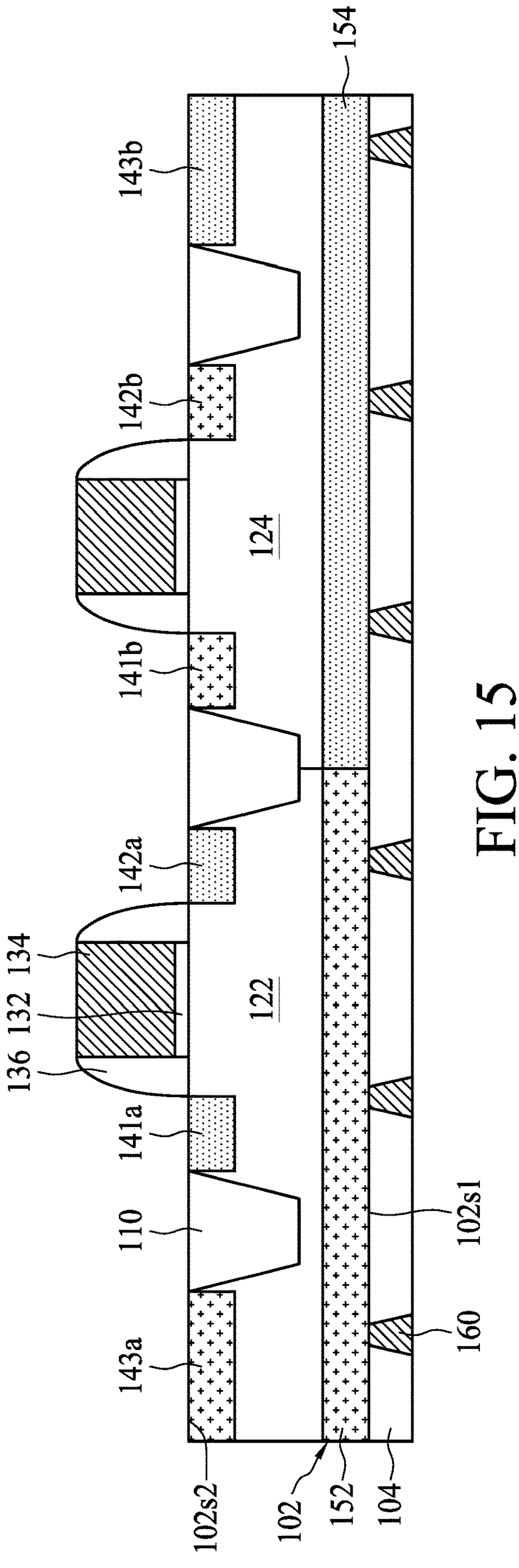
FIG. 15 illustrates one or more stages of an exemplary method for manufacturing a semiconductor device structure according to some embodiments of the present disclosure.

Referring to FIG. 15, conductive elements 160 may be formed within the isolation layer 104. In some embodiments, an etching technique may be performed to pattern the isolation layer 104, which thereby defines openings. Then, a conductive material(s) may be formed within the openings to form the conductive element 160. In some embodiments, the conductive material(s) may be formed by a physical vapor deposition (PVD), ALD, CVD, or a combination thereof.

Figure 16:
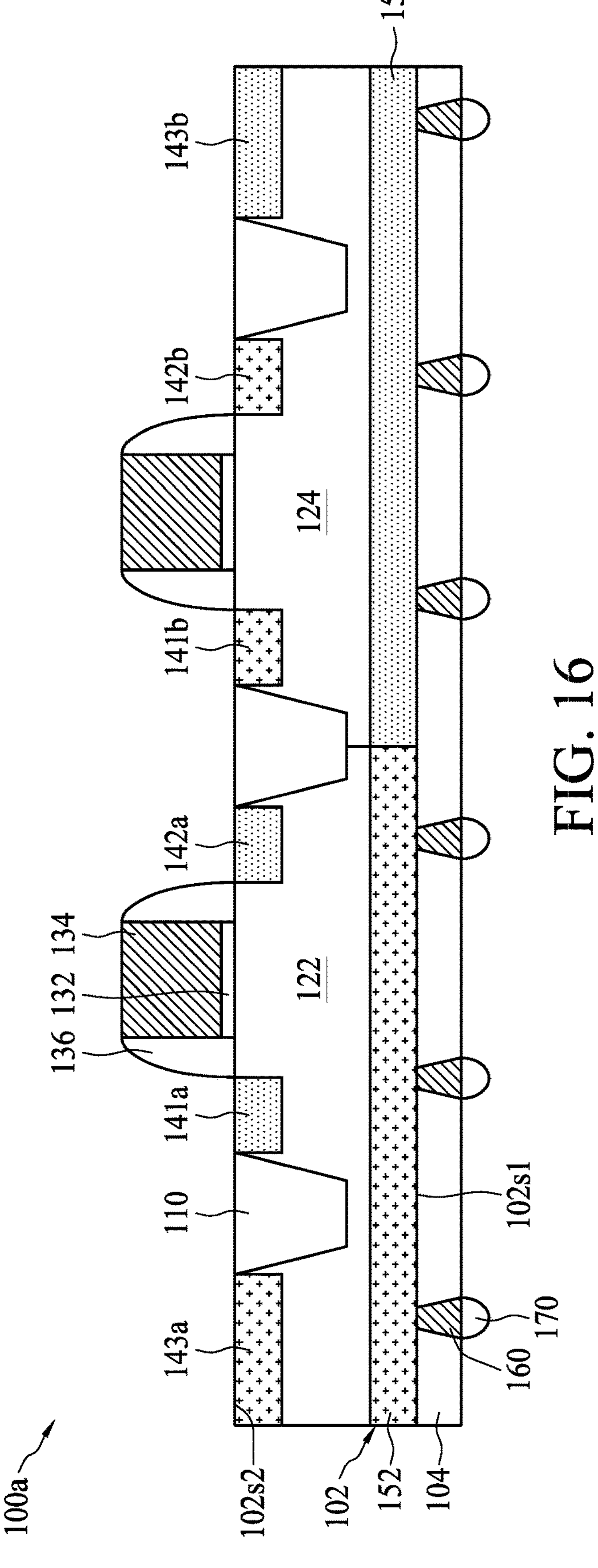
FIG. 16 illustrates one or more stages of an exemplary method for manufacturing a semiconductor device structure according to some embodiments of the present disclosure.

Referring to FIG. 16, electrical connectors 170 may be formed on or under the conductive element 160. Thus, a semiconductor device structure (e.g., the semiconductor device structure as shown in FIG. 1) may be produced.

Figure 17:
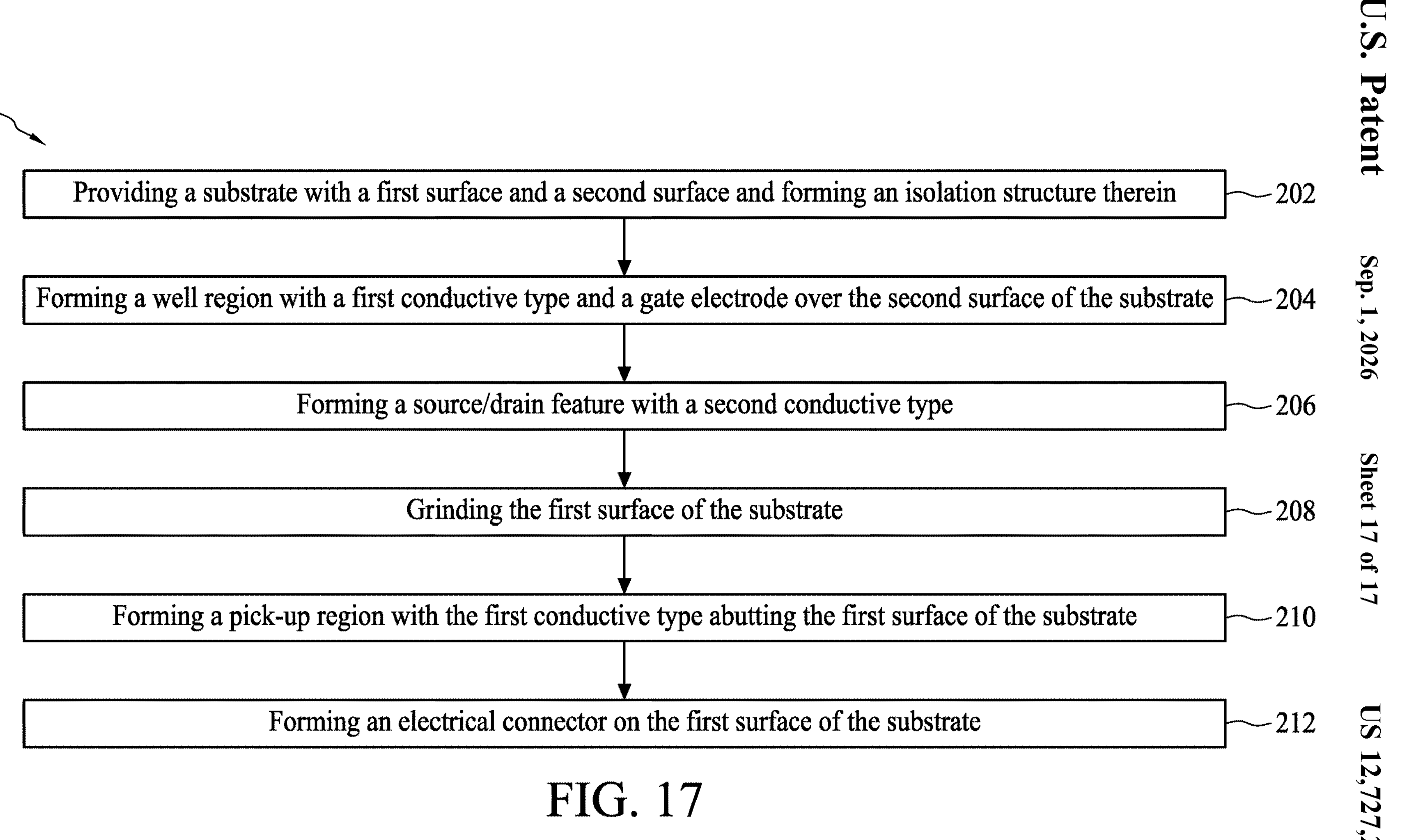
FIG. 17 is a flowchart illustrating a method of manufacturing a semiconductor device structure, in accordance with some embodiments of the present disclosure.

FIG. 17 is a flowchart illustrating a method 200 of manufacturing a semiconductor device structure, in accordance with some embodiments of the present disclosure.

The method 200 may begin with operation 202 in which a substrate is provided. The substrate may include a semiconductor-on-insulator substrate, and an isolation layer is formed therein. FIG. 7 depicts a stage corresponding to operation 202.

The method 200 may continue with operation 204 in which a well region is formed within the substrate and a gate electrode is formed over the second surface of the substrate. The well region has a first conductive type. Further, a spacer may be formed on two opposite sides of the gate electrode. FIG. 8 to FIG. 11 depict a stage corresponding to operation 204.

The method 200 may continue with operation 206 in which an S/D feature is formed. The S/D feature has a second conductive type different from the first conductive type. The S/D feature abuts the second surface of the substrate. Further, a first pick-up region may be formed. The first pick-up region abuts the second surface of the substrate and has the first conductive type. FIG. 12 depicts a stage corresponding to operation 206.

The method 200 may continue with operation 208 in which the first surface of the substrate is ground or polished. The isolation layer may be exposed. FIG. 13 depicts a stage corresponding to operation 208.

The method 200 may continue with operation 210 in which a second pick-up region may be formed. The second pick-up region abuts the first surface of the substrate and has the first conductive type. The second pick-up region vertically overlap the S/D feature. The second pick-up region is configured to guide or neutralize a drift current from an induced depletion region of the S/D feature caused by a cosmic ray toward the first surface of the substrate. FIG. 14 depicts a stage corresponding to operation 210.

The method 200 may continue with operation 212 in which conductive elements and electrical connectors are formed. The conductive elements are formed within the isolation layer. The electrical connectors are formed on and electrically connected to the conductive elements. FIG. 15 and FIG. 16 depict a stage corresponding to operation 212.

The method 200 is merely an example, and is not intended to limit the present disclosure beyond what is explicitly recited in the claims. Additional operations can be provided before, during, or after each operations of the method 200, and some operations described can be replaced, eliminated, or reordered for additional embodiments of the method. In some embodiments, the method 200 can include further operations not depicted in FIG. 17. In some embodiments, the method 200 can include one or more operations depicted in FIG. 17.

One aspect of the present disclosure provides a semiconductor device structure. The semiconductor device structure includes a substrate, a first well region, a source/drain (S/D) feature, and pick-up region. The substrate has a first surface and a second surface opposite to the first surface. The first well region abuts the second surface of the substrate and has a first conducive type. The S/D feature abuts the second surface of the substrate and has a second conductive type different from the first conductive type. The pick-up region abuts the first surface of the substrate and has the first conductive type.

One aspect of the present disclosure provides a semiconductor device structure. The semiconductor device structure includes a substrate, a first well region, a source/drain (S/D) feature, an isolation feature, and a first pick-up region. The substrate has a first surface and a second surface opposite to the first surface. The first well region abuts the second surface of the substrate and has a first conducive type. The S/D feature abuts the second surface of the substrate and has a second conductive type different from the first conductive type. The isolation structure is embedded within the substrate and extends from the second surface toward the first surface of the substrate. The first pick-up region has the first conductive type situated between the first surface of the substrate and the isolation structure.

Another aspect of the present disclosure provides a method of manufacturing a semiconductor device structure. The method includes providing a substrate having a first surface and a second surface opposite to the first surface. The methods also includes forming a first well region abutting the second surface of the substrate. The first well region has a first conducive type. The method further includes forming a source/drain (S/D) feature abutting the second surface of the substrate. The S/D feature has a second conductive type different from the first conductive type. Moreover, the method includes forming a pick-up region abutting the first surface of the substrate. The pick-up region has the first conductive type.

The embodiments of the present disclosure provide a semiconductor device structure. The semiconductor device structure includes a pick-up region and a source/drain feature on opposite two surfaces of a substrate. The pick-up region is configured to provide a low resistance path to lead a drift current to flow out the semiconductor device structure through a backside surface. The pick-up region can provide a relatively short path for transmitting the drift current and reduce the leakage caused by a cosmic ray incident to the semiconductor device structure.

Although the present disclosure and its advantages have been described in detail, it should be understood that various changes, substitutions and alterations may be made herein without departing from the spirit and scope of the disclosure as defined by the appended claims. For example, many of the processes discussed above may be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods, or steps.

What is claimed is:

1. A semiconductor device structure, comprising:

a substrate having a first surface and a second surface opposite to the first surface;

a first well region abutting the second surface of the substrate and having a first conducive type;

a source/drain (S/D) feature abutting the second surface of the substrate and having a second conductive type different from the first conductive type;

an isolation structure embedded within the substrate and extending from the second surface toward the first surface of the substrate; and a first pick-up region having the first conductive type situated between the first surface of the substrate and the isolation structure;

wherein the first pick-up region is in contact with the isolation structure.

2. The semiconductor device structure of claim 1, further comprising:

an electrical connector disposed on the first surface and electrically connected to the first pick-up region.

3. The semiconductor device structure of claim 2, further comprising:

an isolation layer disposed between the electrical connector and the substrate; and a conductive element embedded within the isolation layer and electrically connecting the first pick-up region and the electrical connector.

4. The semiconductor device structure of claim 2, wherein the electrical connector is electrically connected to ground.

5. The semiconductor device structure of claim 1, wherein the first pick-up region is spaced apart from the isolation structure.

6. The semiconductor device structure of claim 1, wherein the first pick-up region has a first portion and a second portion spaced apart from the first portion.

7. The semiconductor device structure of claim 6, wherein the first well region is further disposed between the first portion and the second portion of the first pick-up region.

8. The semiconductor device structure of claim 6, wherein the first portion of the first pick-up region vertically overlap the S/D feature.

9. The semiconductor device structure of claim 1, further comprising:

a second pick-up region abutting the second surface of the substrate and having the second conductive type, wherein the second pick-up region is spaced apart from the S/D feature by the isolation structure.

10. The semiconductor device structure of claim 9, wherein a dopant concentration of the first pick-up region is substantially equal to that of the second pick-up region.

* * * * *